(12) United States Patent
Briano et al.

(10) Patent No.: US 12,733,512 B2
(45) Date of Patent: Sep. 8, 2026

(54) PACKAGED CURRENT SENSOR INTEGRATED CIRCUIT

(71) Applicant: Allegro MicroSystems, LLC, Manchester, NH (US)

(72) Inventors: Robert A. Briano, Auburn, NH (US); Shixi Louis Liu, Hooksett, NH (US)

(73) Assignee: Allegro MicroSystem, LLC, Manchester, NH (US)

( * ) Notice: Subject to any disclaimer, the term of this patent is extended or adjusted under 35 U.S.C. 154(b) by 441 days.

(21) Appl. No.: 18/490,815

(22) Filed: Oct. 20, 2023

(65) Prior Publication Data

US 2024/0047314 A1 Feb. 8, 2024

Related U.S. Application Data

(63) Continuation-in-part of application No. 18/182,434, filed on Mar. 13, 2023, now Pat. No. 12,487,254, (Continued)

(51) Int. Cl.
*H10W 70/40* (2026.01)
*G01R 15/20* (2006.01)
(Continued)

(52) U.S. Cl.
CPC ........ *H10W 70/421* (2026.01); *G01R 15/202* (2013.01); *G01R 19/0092* (2013.01); (Continued)

(58) Field of Classification Search
None
See application file for complete search history.

(56) References Cited

U.S. PATENT DOCUMENTS 5,210,493 A 5/1993 Schroeder et al.
5,255,157 A 10/1993 Hegel
(Continued)

FOREIGN PATENT DOCUMENTS

EP 3671228 6/2020
EP 4141451 3/2023
(Continued)

OTHER PUBLICATIONS

U.S. Non-Final Office Action dated Jul. 28, 2025 for U.S. Appl. No. 18/512,122; 13 Pages.
(Continued)

*Primary Examiner* — William B Partridge
*Assistant Examiner* — Alexandre X Ramirez
(74) *Attorney, Agent, or Firm* — DALY, CROWLEY, MOFFORD & DURKEE, LLP

(57) ABSTRACT

A current sensor integrated circuit package includes a primary conductor having an input portion and an output portion, both with reduced area edges. Secondary leads each have an exposed portion and an elongated portion that is offset with respect to the exposed portion. A semiconductor die is disposed adjacent to the primary conductor on an insulator portion and at least one magnetic field sensing element is supported by the semiconductor die. A package body includes a first portion enclosing the semiconductor die and a portion of the primary conductor and a second portion enclosing the elongated portion of the plurality of secondary leads. The first package body portion has a first width configured to expose the input and output portions of the primary conductor and the second package body portion has a second width between a first and second package body side edges that is larger than the first width.

21 Claims, 12 Drawing Sheets

Related U.S. Application Data which is a continuation-in-part of application No. 18/053,480, filed on Nov. 8, 2022, now Pat. No. 12,163,983, which is a continuation-in-part of application No. 17/654,254, filed on Mar. 10, 2022, now Pat. No. 11,768,229, which is a continuation-in-part of application No. 17/409,011, filed on Aug. 23, 2021, now Pat. No. 11,519,946.

(51) Int. Cl.
*G01R 19/00* (2006.01)
*H10N 52/00* (2023.01)
*H10N 59/00* (2026.01)
*H10W 74/10* (2026.01)
*H10W 90/00* (2026.01)

(52) U.S. Cl.
CPC ............. *H10N 52/00* (2023.02); *H10N 59/00* (2023.02); *H10W 74/111* (2026.01); *H10W 90/756* (2026.01)

(56) References Cited

U.S. PATENT DOCUMENTS 5,289,344 A * 2/1994 Gagnon .............. H10W 70/481 257/E23.044
5,557,504 A 9/1996 Siegel et al.
5,570,273 A 10/1996 Siegel et al.
5,963,028 A 10/1999 Engel et al.
6,211,462 B1 4/2001 Carter, Jr. et al.
6,265,865 B1 7/2001 Engel et al.
6,306,684 B1 10/2001 Richardson et al.
6,326,243 B1 12/2001 Suzuya et al.
6,356,068 B1 3/2002 Steiner et al.
6,781,359 B2 8/2004 Stauth et al.
6,995,315 B2 2/2006 Sharma et al.
7,005,754 B2 2/2006 Howarth
7,075,287 B1 7/2006 Mangtani et al.
7,166,807 B2 1/2007 Gagnon et al.
7,183,485 B2 2/2007 Groothuis et al.
7,259,545 B2 8/2007 Stauth et al.
7,265,531 B2 9/2007 Stauth et al.
7,301,229 B2 11/2007 Yau
7,372,147 B2 5/2008 Dai et al.
7,476,816 B2 1/2009 Doogue et al.
7,518,354 B2 4/2009 Stauth et al.
7,554,180 B2 6/2009 McKerreghan et al.
7,598,601 B2 10/2009 Taylor et al.
7,709,754 B2 5/2010 Doogue et al.
7,746,056 B2 6/2010 Stauth et al.
7,816,905 B2 10/2010 Doogue et al.
8,080,994 B2 12/2011 Taylor et al.
8,461,677 B2 6/2013 Ararao et al.
8,486,755 B2 7/2013 Ararao et al.
8,604,777 B2 12/2013 Doogue et al.
8,629,539 B2 1/2014 Milano et al.
8,907,437 B2 12/2014 Milano et al.
9,190,606 B2 11/2015 Liu et al.
9,222,992 B2 12/2015 Ausserlechner et al.
9,228,860 B2 1/2016 Sharma et al.
9,299,915 B2 3/2016 Milano et al.
9,383,425 B2 7/2016 Milano et al.
9,411,025 B2 8/2016 David et al.
9,494,660 B2 11/2016 David et al.
9,620,705 B2 4/2017 Milano et al.
9,666,788 B2 5/2017 Taylor et al.
9,788,403 B2 10/2017 Mrusek
9,812,588 B2 11/2017 Vig et al.
9,865,807 B2 1/2018 Liu et al.
10,120,041 B2 11/2018 Haas et al.
10,132,879 B2 11/2018 Latham et al.
10,230,006 B2 3/2019 Vig et al.
10,234,513 B2 3/2019 Vig et al.
10,333,055 B2 6/2019 Milano et al.
10,345,343 B2 7/2019 Milano et al.
10,352,969 B2 7/2019 Milano et al.
10,509,058 B2 12/2019 Cadugan et al.
10,578,684 B2 3/2020 Cadugan et al.
10,607,925 B2 3/2020 David et al.
10,718,794 B2 7/2020 El Bacha et al.
10,725,100 B2 7/2020 Milano et al.
10,753,963 B2 8/2020 Milano et al.
10,916,665 B2 2/2021 Vig et al.
11,024,576 B1 6/2021 West et al.
11,085,952 B2 8/2021 Cadugan et al.
11,183,436 B2 11/2021 Liu et al.
11,289,406 B2 3/2022 Briano et al.
11,444,209 B2 9/2022 Vig et al.
11,519,946 B1 12/2022 Rock et al.
11,538,744 B2 12/2022 Yandoc et al.
11,768,229 B2 9/2023 Boden et al.
11,768,230 B1 9/2023 Liu et al.
2002/0190703 A1 12/2002 Goto et al.
2003/0073265 A1* 4/2003 Hu ...................... H10W 74/016 257/E21.504
2003/0193018 A1 10/2003 Tao et al.
2004/0113240 A1* 6/2004 Hauser ................ H10W 70/481 257/E23.044
2004/0124505 A1 7/2004 Mahle et al.
2005/0030018 A1 2/2005 Shibahara et al.
2005/0124185 A1 6/2005 Cromwell et al.
2007/0126092 A1 6/2007 San Antonio et al.
2007/0279053 A1 12/2007 Taylor et al.
2010/0156394 A1 6/2010 Ausserlechner et al.
2011/0049685 A1 3/2011 Park et al.
2011/0234215 A1 9/2011 Ausserlechner
2011/0248711 A1 10/2011 Ausserlechner
2012/0080781 A1 4/2012 Li et al.
2012/0089266 A1 4/2012 Tomimbang et al.
2013/0138372 A1 5/2013 Ausserlechner
2014/0253103 A1 9/2014 Racz et al.
2015/0108967 A1 4/2015 Barczyk
2015/0270198 A1 9/2015 Cuoco et al.
2015/0285874 A1 10/2015 Taylor et al.
2016/0187388 A1 6/2016 Suzuki et al.
2016/0216296 A1 7/2016 Nakayama et al.
2016/0223594 A1 8/2016 Suzuki et al.
2016/0282388 A1* 9/2016 Milano .................. G01R 15/20
2016/0313375 A1 10/2016 Etschmaier
2017/0179067 A1 6/2017 Aoki et al.
2018/0166350 A1 6/2018 Racz et al.
2018/0180649 A1 6/2018 Paci et al.
2018/0306843 A1 10/2018 Bussing et al.
2019/0006266 A1 1/2019 Gomez et al.
2019/0049527 A1 2/2019 Vig et al.
2019/0154737 A1 5/2019 Nobira
2019/0204363 A1 7/2019 Suzuki et al.
2019/0369144 A1 12/2019 Mauder et al.
2020/0033384 A1 1/2020 Kishi et al.
2020/0064382 A1 2/2020 Takata et al.
2020/0191835 A1 6/2020 Bilbao De Mendizabal et al.
2020/0381323 A1* 12/2020 Jochi .................. H10W 70/429
2021/0243911 A1 8/2021 Tang et al.
2021/0263077 A1 8/2021 Hirano et al.
2021/0397015 A1 12/2021 Moon
2022/0018880 A1 1/2022 Houis
2022/0026469 A1 1/2022 Schmitt
2023/0060219 A1 3/2023 Liu et al.
2023/0221355 A1 7/2023 Liu

FOREIGN PATENT DOCUMENTS

FR 3090121 6/2020
JP 2001-221815 A 8/2001

OTHER PUBLICATIONS

Response to U.S. Non-Final Office Action dated Jul. 28, 2025 for U.S. Appl. No. 18/512,122; Response Filed Jul. 31, 2025; 8 Pages.
U.S. Notice of Allowance dated Jul. 29, 2025 for U.S. Appl. No. 18/182,434; 8 Pages.
U.S. Appl. No. 18/447,665, filed Aug. 10, 2023, Kasparek.

(56) References Cited

OTHER PUBLICATIONS

U.S. Appl. No. 18/450,494, filed Aug. 16, 2023, Hein et al.
U.S. Appl. No. 18/512,122, filed Nov. 17, 2023, McNally et al.
U.S. Appl. No. 18/624,271, filed Apr. 2, 2024, Wang et al.
Allegro MicroSystems, LLC, "Thermal Design for Plastic Integrated Circuits;" Package Information document; Mar. 3, 2016; 4 Pages.
Beeker, "PCB Design Techniques to Improved ESD Robustness;" AMF-DES-T2360; PowerPoint Presentation; Oct. 2016; 72 Pages.
Chen, "The Intricacies of Lead Frames in the Semiconductor Industry;" Article Published Sep. 2, 2023; 12 Pages.
Sauber et al., "Guidelines for Designing Subassemblies Using Hall-Effect Devices;" Allegro MicroSystems, LLC Product Information Data Sheet AN277031, Rev. 19; May 4, 2021; 10 Pages.
Response to U.S. Non-Final Office Action dated Mar. 19, 2025 for U.S. Appl. No. 18/182,434; Response Filed Jun. 5, 2025; 14 Pages.
Notice of Allowance dated Oct. 23, 2024 for U.S. Appl. No. 18/053,480; 7 pages.
U.S. Non-Final Office Action dated Oct. 1, 2024 for U.S. Appl. No. 18/053,480; 17 Pages.
Response to U.S. Non-Final Office Action dated Oct. 1, 2024 for U.S. Appl. No. 18/053,480; Response filed on Oct. 7, 2024; 9 Pages.
U.S. Non-Final Office Action dated Mar. 19, 2025 for U.S. Appl. No. 18/182,434; 12 Pages.
U.S. Appl. No. 17/817,796, filed Aug. 5, 2022, Briano, et al.
Preliminary Amendment filed on Jan. 12, 2022 for U.S. Appl. No. 17/409,011; 6 pages.
European Examination Report dated Aug. 28, 2023 for European Application No. 22183450.0; 4 pages.
European Extended Search Reporting dated Dec. 22, 2022 for European Application No. 22183450.0; 7 pages.
European Response filed on Jun. 14, 2023 for European Application No. 22183450.0; 24 pages.
Notice of Allowance dated Aug. 23, 2022 for U.S. Appl. No. 17/409,011; 10 pages.
Notice of Allowance dated Aug. 9, 2023 for U.S. Appl. No. 17/654,254; 5 pages.
Office Action dated Mar. 15, 2023 for U.S. Appl. No. 17/654,254; 19 pages.
Response to Office Action dated Mar. 15, 2023 filed on Mar. 22, 2023 for U.S. Appl. No. 17/654,254; 10 pages.
Office Action dated May 19, 2023 for U.S. Appl. No. 17/654,254; 15 pages.
Response to European Examination Report dated Aug. 28, 2023 for European Application No. 22183450.0 as filed on Oct. 30, 2023; 18 pages.
Response to Office Action dated May 19, 2023 filed on May 25, 2023 for U.S. Appl. No. 17/654,254; 15 pages.
Search Reporting and Written Opinion dated Apr. 25, 2023 for PCT Application No. PCT/US2022/051968; 16 pages.
Steve Bush, DNP claims world's thinnest chip package, https://www.electronicsweekly.com/news/products/micros/dnp-claims-worlds-thinnest-chip-package-2009-03/ (Year: 2009).
U.S. Notice of Allowance dated Oct. 15, 2025 for U.S. Appl. No. 18/512,122; 8 Pages.
Response to European Rules 161/162 Communication dated Aug. 19, 2024 for European Application No. 22847650.3; Response Filed Feb. 18, 2025; 21 Pages.
European Examination Report dated Apr. 24, 2025 for European Application No. 22183450.0; 4 Pages.
Restriction Requirement dated Dec. 27, 2024 for U.S. Appl. No. 18/182,434, 6 pages.
Japanese Office Action (with English Translation) dated Apr. 16, 2026 for Japanese Application No. 2024-545133; 10 Pages.
Korean Office Action (with English Translation) dated May 13, 2026 for Korean Application No. 10-2024-7026064; 19 Pages.
Response (with English Translation) to Korean Office Action dated Apr. 16, 2026 for Japanese Application No. 2024-545133; Response Filed May 20, 2026; 23 Pages.

* cited by examiner

PACKAGED CURRENT SENSOR INTEGRATED CIRCUIT

CROSS-REFERENCE TO RELATED APPLICATIONS

This application is a continuation-in-part of and claims priority to and the benefit of U.S. patent application Ser. No. 18/182,434, entitled "Packaged Current Sensor Integrated Circuit" and filed Mar. 13, 2023, which is a continuation-in-part of and claims priority to and the benefit of U.S. patent application Ser. No. 18/053,480, entitled "Packaged Current Sensor Integrated Circuit" and filed Nov. 8, 2022, which is a continuation-in-part of and claims priority to and the benefit of U.S. patent application Ser. No. 17/654,254, entitled "Packaged Current Sensor Integrated Circuit" and filed on Mar. 10, 2022 and issued on Sep. 26, 2023 as U.S. Pat. No. 11,768,229, which is a continuation-in-part of and claims priority to and the benefit of U.S. patent application Ser. No. 17/409,011, entitled "Packaged Current Sensor Integrated Circuit" filed Aug. 23, 2021 and issued on Dec. 6, 2022 as U.S. Pat. No. 11,519,946, the entirety of which are hereby incorporated herein by reference in their entireties.

BACKGROUND

Some conventional current sensors are positioned near a current-carrying conductor to sense a magnetic field generated by a current through the conductor. The current sensor generates an output signal having a magnitude proportional to the magnetic field induced by the current through the conductor.

SUMMARY

According to the disclosure, a current sensor integrated circuit package includes a primary conductor having an input portion into which a current flows, an output portion from which the current flows, and an exposed portion, wherein the input portion has a reduced area edge and the output portion has a reduced area edge. Each of a plurality of secondary leads has an exposed portion spaced from the exposed portion of the primary conductor by an isolation distance of at least 2.0 mm. An elongated portion of each of the plurality of secondary leads is offset with respect to the exposed portion of the respective secondary lead. A semiconductor die is disposed adjacent to the primary conductor and positioned on an insulator portion and at least one magnetic field sensing element is supported by the semiconductor die. A package body includes a first portion enclosing the semiconductor die and a portion of the primary conductor and a second portion enclosing the elongated portion of the plurality of secondary leads. The first portion of the package body has a first width configured to expose the input portion of the primary conductor and the output portion of the primary conductor and the second portion of the package body has a second width between a first side edge of the package body and a second side edge of the package body that is larger than the first width.

Features may include one or more of the following individually or in combination with other features. The exposed input portion of the primary conductor and the exposed output portion of the primary conductor each can have a length of at least 0.5 mm. The exposed input portion of the primary conductor and the exposed output portion of the primary conductor are configured to accept one or both of a clamp or a test probe. The elongated portion of each of the plurality of secondary leads extends in a direction parallel to the first and second side edges of the package body. The reduced area edge of the input portion of the primary conductor does not extend beyond the first side edge of the package body and wherein the reduced area edge of the output portion of the primary conductor does not extend beyond the second side edge of the package body. The package body can be singulated along the reduced area edge of the input portion of the primary conductor and along the reduced area edge of the output portion of the primary conductor.

Each of the plurality of secondary leads can have a substantially constant thickness and wherein each of the plurality of secondary leads is offset with respect to the exposed portion in a direction of a thickness of the respective secondary lead. The elongated portion of each of the plurality of secondary leads can have a thickness smaller than a thickness of the exposed portion of the respective secondary lead. The isolation distance is at least 4.0 mm. The isolation distance can be at least 7.2 mm.

Each of the plurality of secondary leads can include a first secondary lead providing an output connection of the current sensor integrated circuit package, a second secondary lead providing a voltage input connection of the current sensor integrated circuit package, and a third secondary lead providing a ground connection of the current sensor integrated circuit package. The current sensor integrated circuit package can include a front-end amplifier supported by the semiconductor die, wherein the at least one magnetic field sensing element is coupled to the front-end amplifier. The current sensor integrated circuit package can include at least two magnetic field sensing elements. At least two magnetic field sensing elements can be Hall effect elements. The at least two magnetic field sensing elements can be coupled to provide a differential output. At least one of the secondary leads can provide a fault signal connection of the current sensor integrated circuit package.

The current sensor integrated circuit package can further include a wafer backside coating material on a back of the semiconductor die. The current sensor integrated circuit package can include a second wafer backside coating material on the back of the semiconductor die. The exposed portion of the primary conductor can be substantially orthogonal to the first side edge of the package body and the second side edge of the package body. The insulator portion can extend beyond an edge of the primary conductor in a direction towards the plurality of secondary leads, such as by at least 0.1 mm or by at least 0.4 mm.

BRIEF DESCRIPTION OF DRAWINGS

The foregoing features of this disclosure, as well as the disclosure itself, may be more fully understood from the following description of the drawings in which.

DETAILED DESCRIPTION

Figure 1:
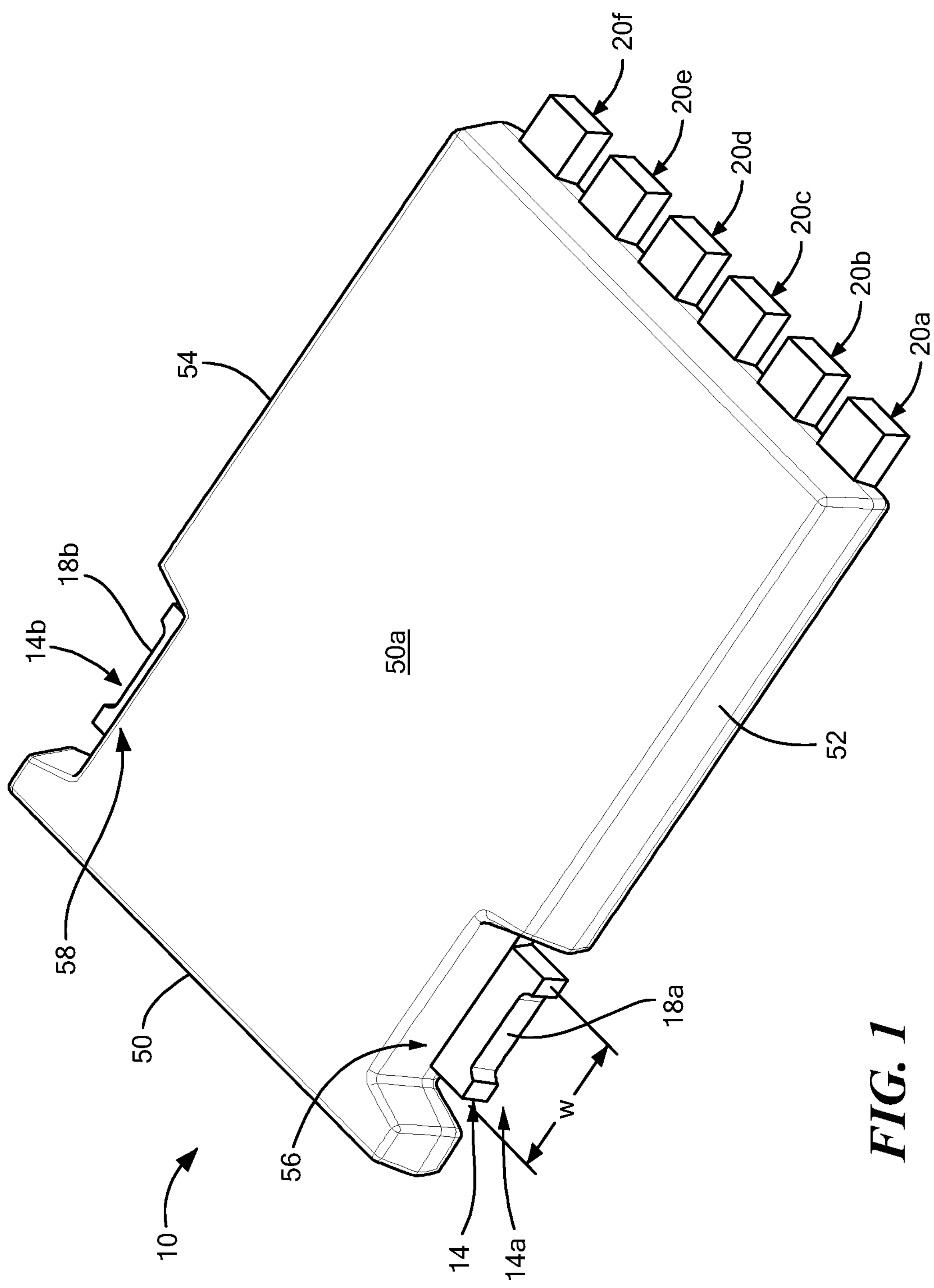
FIG. 1 is a perspective top view of a packaged current sensor integrated circuit according to the disclosure.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall effect element, a vertical Hall effect element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge, configured for single-ended or differential sensing. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). A coil may also be used to sense magnetic fields, which may be referred to as inductive sensing. Using a coil to sense a magnetic field is more typical as the frequency of the magnetic field to be sensed increases.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall effect elements tend to have axes of sensitivity perpendicular to a substrate, while metal based or metallic magnetoresistance elements (e.g., GMR, TMR, AMR) and vertical Hall effect elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 2:
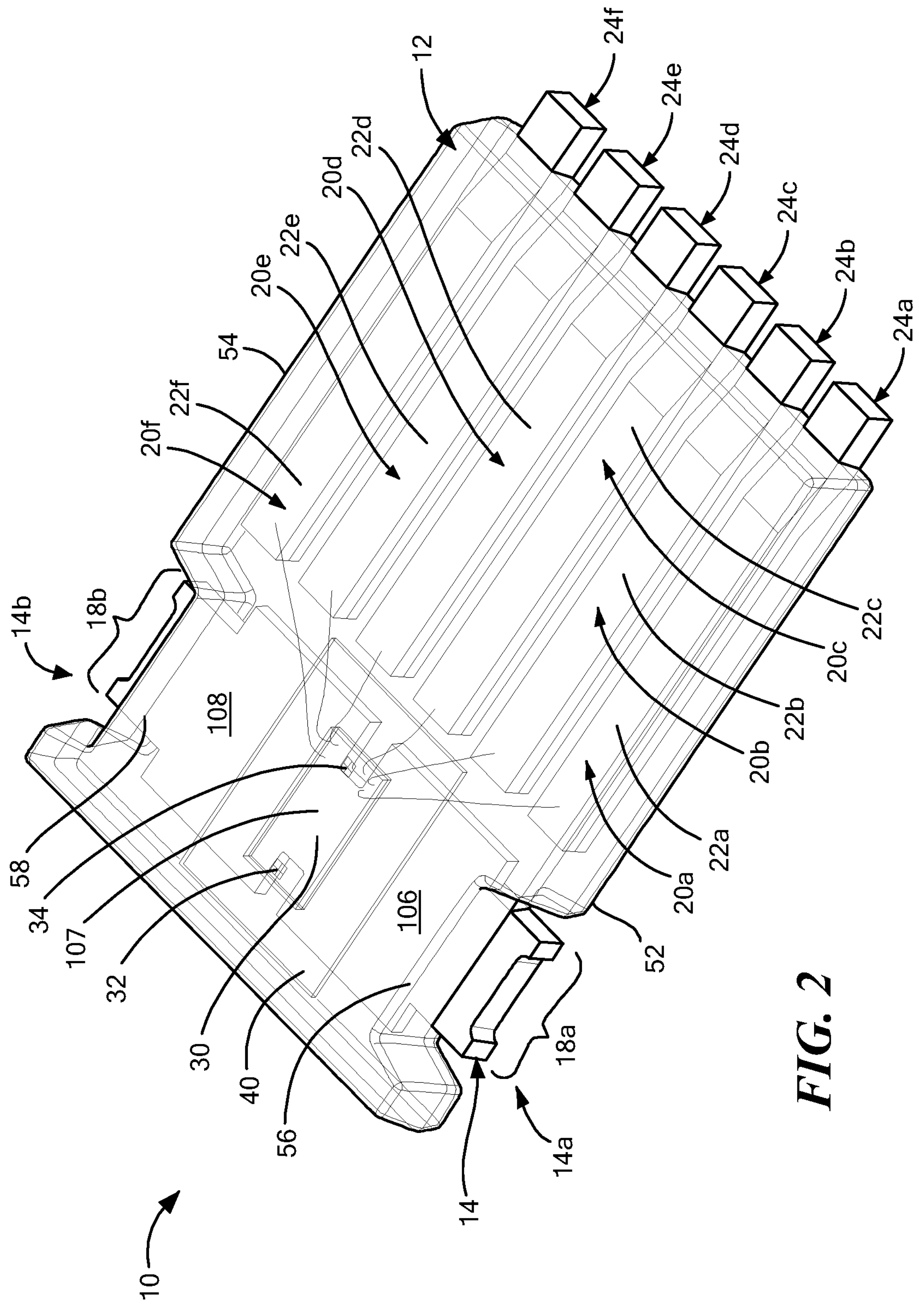
FIG. 2 shows the packaged current sensor integrated circuit of FIG. 1 with the package body in phantom.
Figure 3:
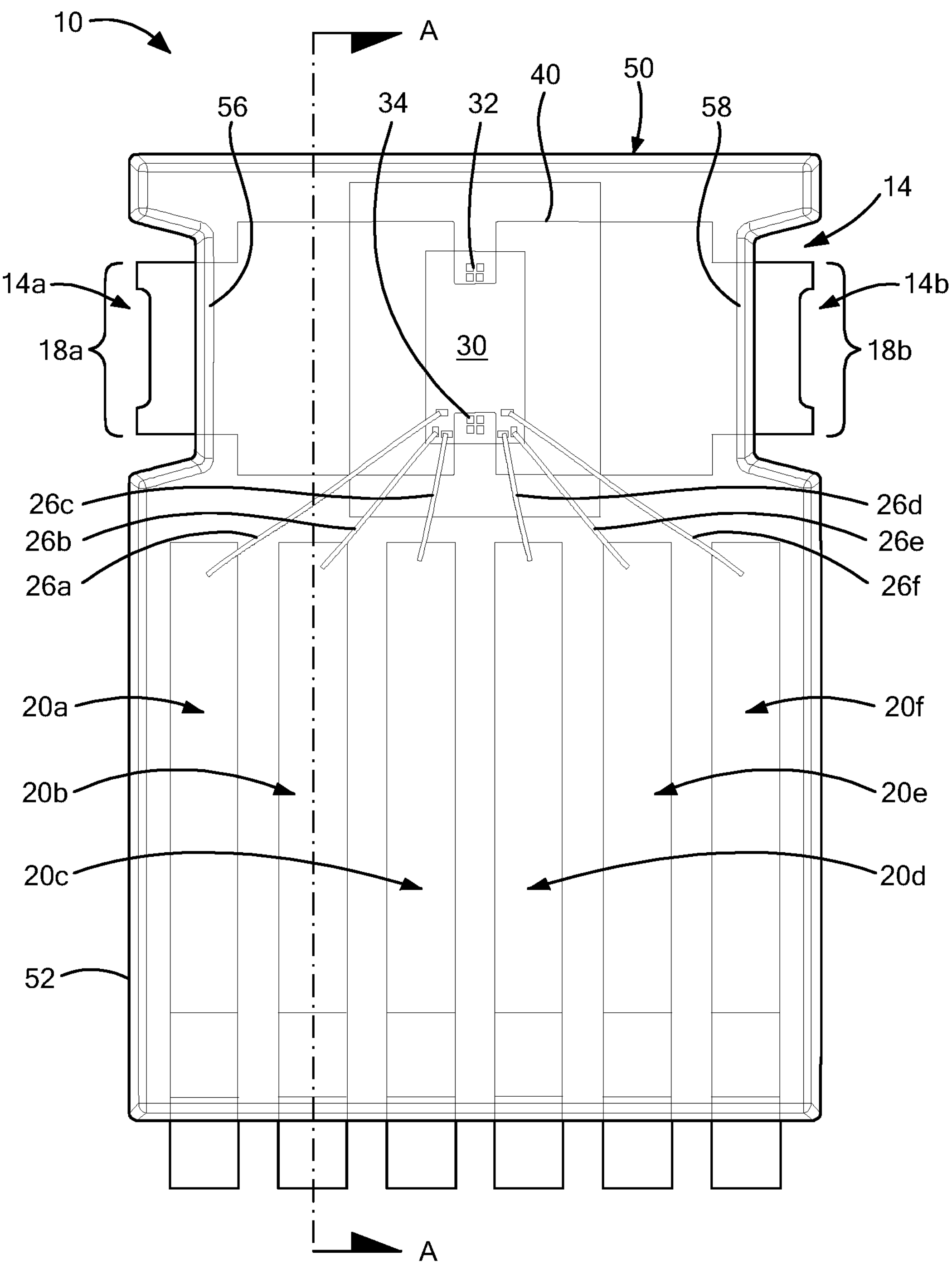
FIG. 3 is a top view of the packaged current sensor integrated circuit of FIG. 1 with the package body in phantom.
Figure 4:
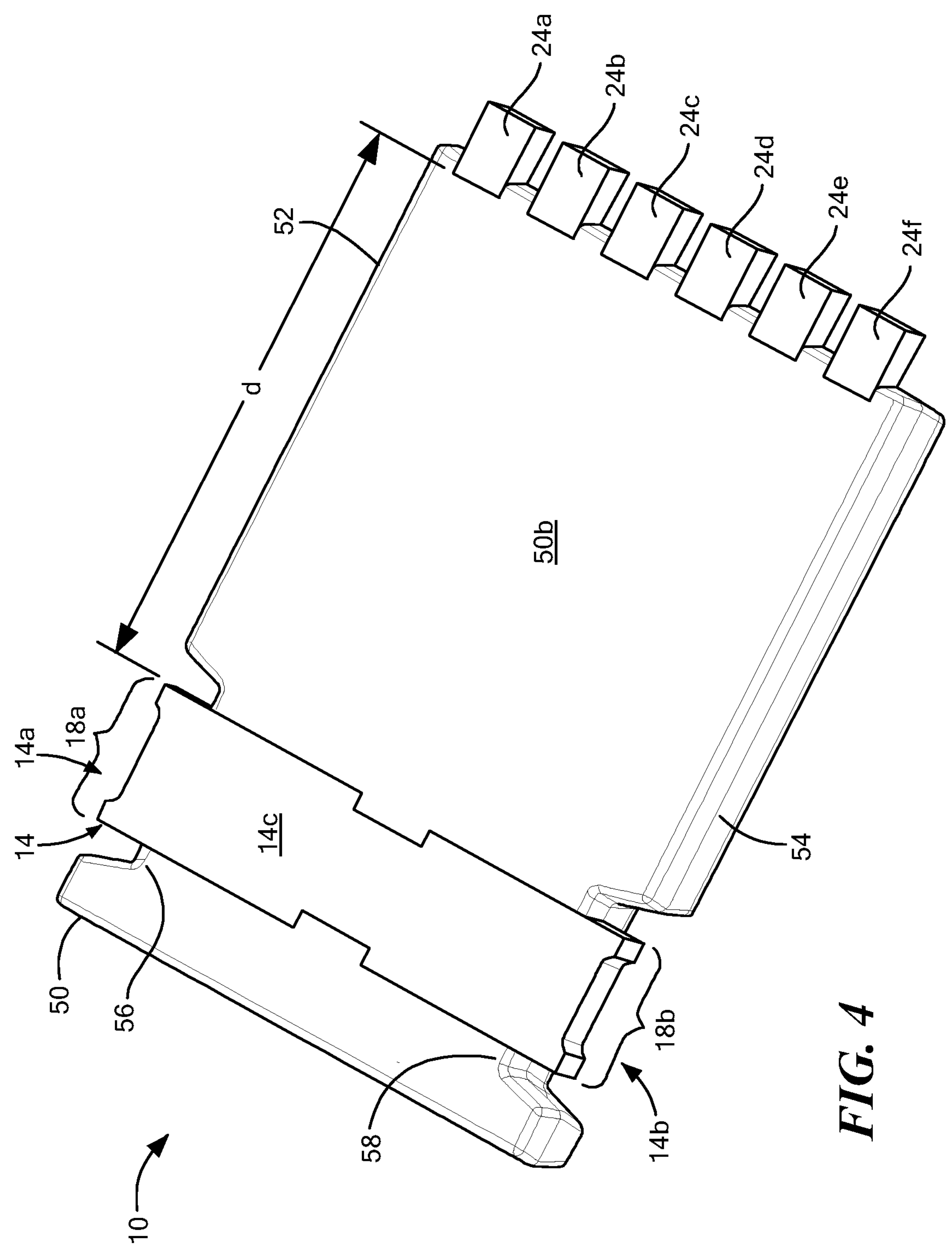
FIG. 4 is a bottom view of the packaged current sensor integrated circuit of FIG. 1.
Figure 5:
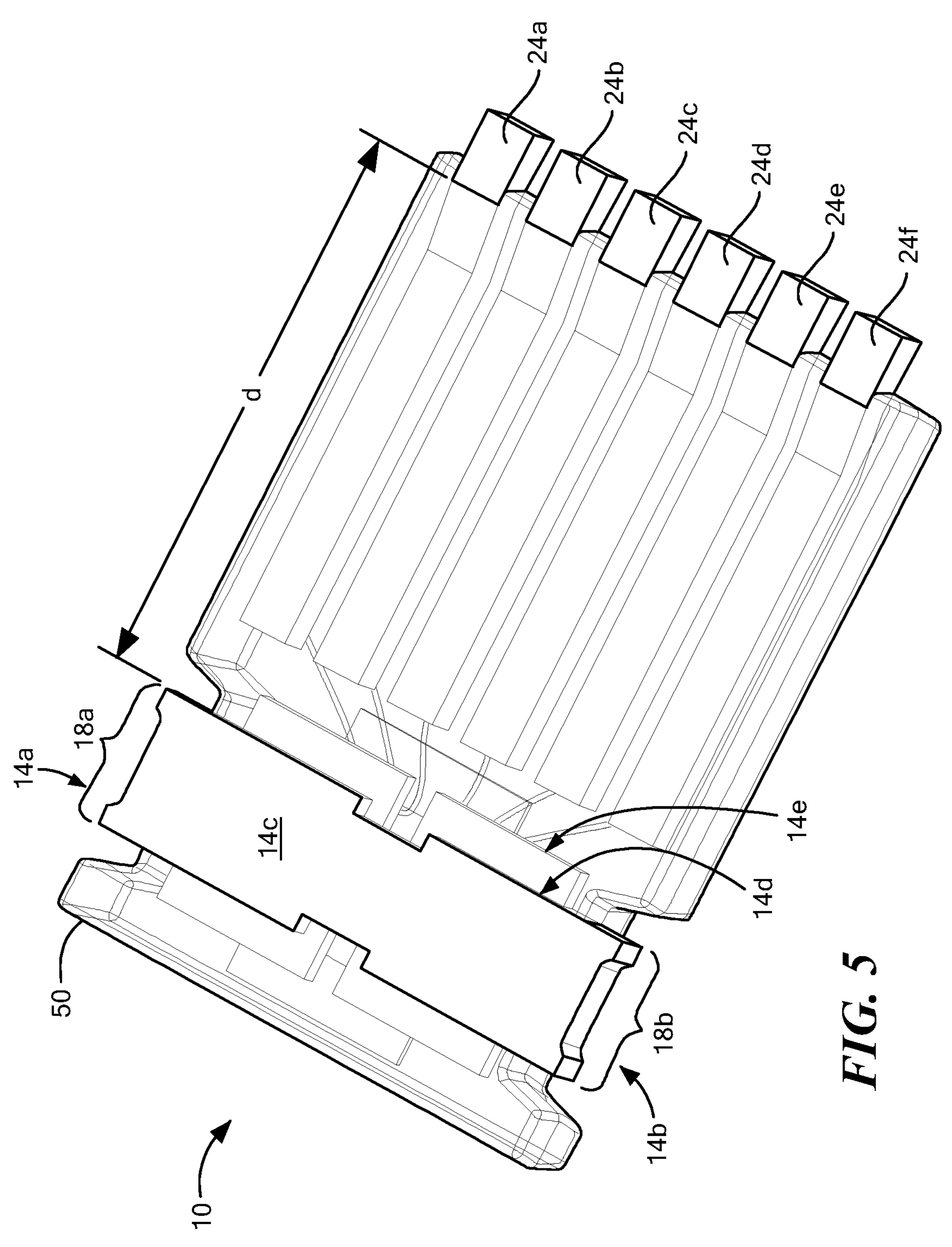
FIG. 5 is a bottom view of the packaged current sensor integrated circuit of FIG. 1 with the package body in phantom.

Referring to the various views of FIGS. 1-6, a packaged current sensor integrated circuit (IC) 10 includes a primary conductor 14 having an input portion 14*a* into which a current flows, an output portion 14*b* from which the current flows, and an exposed portion 14*c* (shown in the bottom views of FIGS. 4 and 5). A secondary lead, such as lead 20*a*, has an exposed portion 24*a* that is spaced from the exposed portion 14*c* of the primary conductor 14 by an isolation distance "d" (shown in the bottom views of FIGS. 4, 5, and 6). A semiconductor die 30 is disposed adjacent to the primary conductor 14 and is positioned on an insulator portion 40. At least one magnetic field sensing element 32, 34 is supported by the semiconductor die 30. A package body 50 encloses the semiconductor die 30 and a portion of the primary conductor 14 and has an upper package body surface 50*a*, a lower package body surface 50*b*, and side package edges 52, 54. A lead frame 12 (labeled in FIG. 2) includes the primary conductor 14 and one or more secondary leads (here a plurality of secondary leads 20*a*-20*f*).

According to an aspect of the disclosure, the input portion 14*a* of the primary conductor 14 has a reduced area edge 18*a* and the output portion 14*b* has a reduced area edge 18*b*. By reduced area edge it is meant that the edge surface has a reduced surface area as compared to a flat edge. Each example reduced area edge 18*a*, 18*b* has a notch between edge ends, as shown. The reduced area edges 18*a*, 18*b* provide tie bars which, during fabrication, are connected to like edges of primary conductors of adjacently fabricated packages. In other words, multiple current sensor integrated circuits are fabricated from a single lead frame (coupled together by tie bars in the form of the reduced area edges 18*a*, 18*b*) and are singulated along the side edges 52, 54 of the package body 50 through the reduced area edges 18*a*, 18*b*.

Providing primary conductor edges 18*a*, 18*b* along which the package is singulated (i.e., the connecting tie bar area) with a reduced area (i.e., as opposed a solid edge of a width "w" that needs to be cut) reduces the force required by the singulation process. For example, in the case of punching to singulate, the force required to punch through the reduced edge area is less and therefore, the IC package experiences lower stress and wear on the punch tool is reduced.

The example current sensor integrated circuit 10 has secondary leads 20*a*, 20*b*, 20*c*, 20*d*, 20*e*, 20*f*. In other embodiments, in which fewer than the illustrated six leads are required or more than the illustrated six leads are required for providing more power, ground, output signals, a fault signal, or other input and output pins, there may be fewer or more than six secondary leads. Wire bonds 26*a*, 26*b*, 26*c*, 26*d*, 26*e*, 26*f* connect the die 30 to the secondary, or signal leads, 20*a*, 20*b*, 20*c*, 20*d*, 20*e*, 20*f*, respectively, as shown in the views of FIGS. 2 and 3. In an embodiment, one or more secondary leads 20*a*, 20*b*, 20*c*, 20*d*, 20*e*, 20*f* can be connected to die 30 using two or more wire bonds. This may be advantageous when a potential for higher current exists in the operation of the integrated circuit, such as for a power or ground connection to die 30.

Secondary leads 20*a*-20*f* can be elongated from a first end adjacent to the primary conductor 14 to the exposed portion

24*a*-24*f*, respectively, and thus, can be described as having an elongated portion 22*a*, 22*b*, 22*c*, 22*d*, 22*e*, 22*f*. Secondary leads 20*a*-20*f* can have a substantially constant thickness "t" (labeled in FIG. 6).

Creepage refers to the shortest distance between primary and secondary conductors along a surface of any insulation material common to both parts, such as the lower surface 50*b* of the package body 50 outside of the package. The isolation distance "d" between the exposed portion 14*c* of the primary conductor 14 and the exposed portion 24*a*-24*f* of any secondary lead 20*a*-20*f*, respectively, provides the creepage distance and can be at least 2.0 mm.

Figure 6:
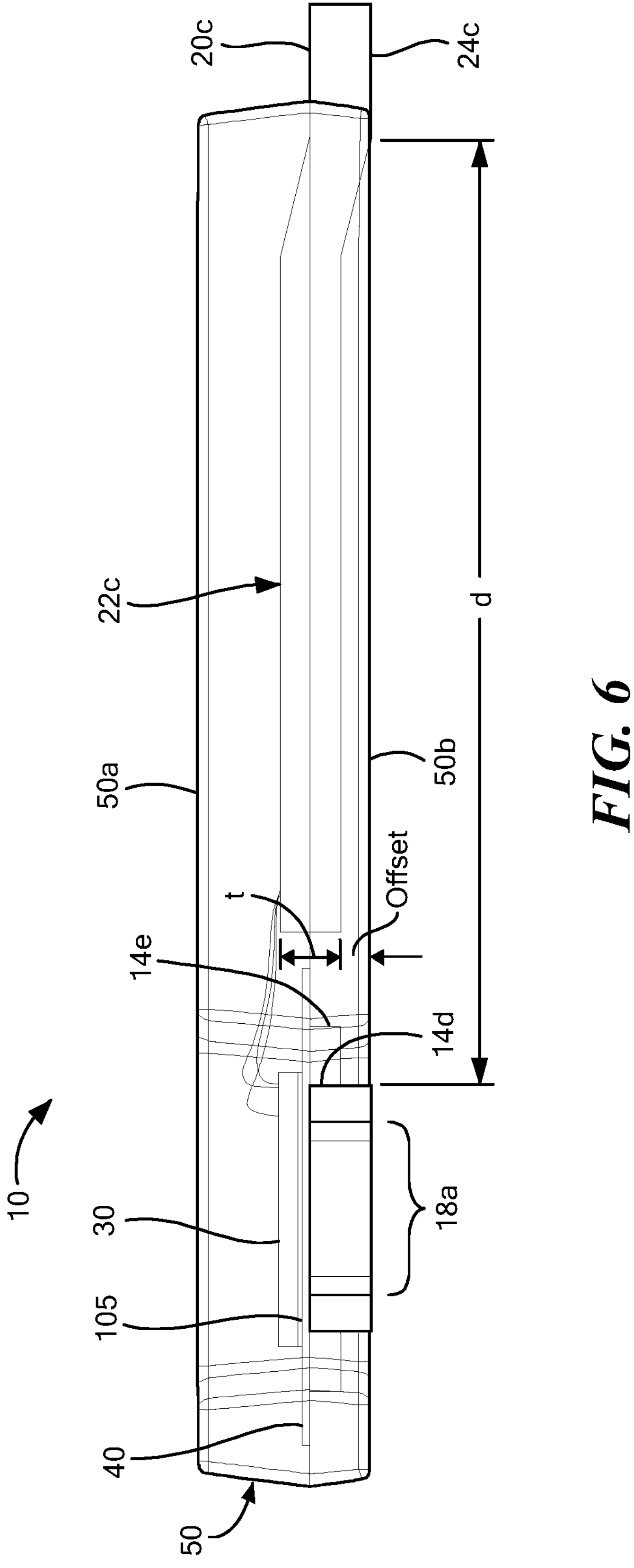
FIG. 6 is a cross-sectional side view of the packaged current sensor integrated circuit of FIG. 1 taken along the line A-A of FIG. 3.

According to a further aspect of the disclosure, the elongated portion 22*a*, 22*b*, 22*c*, 22*d*, 22*e*, 22*f* of the secondary leads 20*a*, 20*b*, 20*c*, 20*d*, 20*e*, 20*f*, and 20*g*, respectively, is offset with respect to the exposed portion 24*a*, 24*b*, 24*c*, 24*d*, 24*e*, 24*f* of the respective secondary lead in a direction of the package height or, in other words, the secondary leads 20*a*-20*f* are offset with respect to the exposed portions 24*a*-24*f* in the direction of a thickness "t" as shown (see FIG. 6). A typical lead thickness "t" can be on the order of 0.5 mm. In embodiments, the dimension of the offset of the secondary leads 20*a*-20*f* can be on the order of 0.25 mm. However, it will be appreciated by those of ordinary skill in the art that a smaller offset dimension, such as on the order of 0.1 mm, or a larger offset dimension are possible.

With this arrangement, achieving a desired creepage distance can be facilitated by providing the secondary leads 20*a*-20*f* with an offset elongated portion 22*a*-22*f* that is thereby encapsulated by the package body 50. In other words, by offsetting the secondary leads 20*a*-20*f* in this manner, the bottom surface of the elongated portion 22*a*-22*f* is encased by the mold material of the package body 50, resulting in the creepage distance "d" extending between the exposed portion 14*c* of the primary conductor 14 and the exposed portions 24*a*-24*f* of the secondary leads 20*a*-20*f*. Notably, this offset arrangement of secondary leads can achieve the same creepage as using secondary leads that have a thinned elongated portion formed by of a half etch process but can alleviate manufacturing challenges associated with half etch processing of long leads since such relatively long half etched secondary leads can be prone to bending.

In embodiments, the isolation, or creepage distance "d" is at least 7.2 mm and can be at least 8.0 mm. With a creepage distance of at least 7.2 mm, reinforced isolation according to a standard, such as IEC60664, is achieved for basic working voltages >1000 VRMS. In some embodiments, lower voltage isolation requirements may exist and the isolation distance "d" may be at least 1.0 mm, 2.0 mm, or 4.0 mm to meet certain isolation requirements in different applications.

Clearance refers to the shortest distance between conductors of differing voltage levels, such as between primary and secondary conductors, through an insulating material, such as air outside of the package or through an insulating material inside or outside the package.

Increased clearance distance in the described embodiments can be facilitated by the insulator portion 40 extending beyond an edge, such as a top edge 14*e* of the primary conductor 14 as shown in FIG. 6, since such extended insulator portion increases the clearance distance between the lower voltage level semiconductor die 30 and the higher voltage primary conductor 14. The insulator portion 40 extends beyond edge 14*e* of the primary conductor 14 in order to provide voltage isolation. In general (although the illustrated insulator portion 40 extends beyond the primary conductor edge 14*e* in an example embodiment), the insulator portion 40 need only extend beyond the die 30 by at least 200 microns and preferably by 400 microns. In an embodiment, the insulator portion 40 may extend beyond the edge 14*e* of the primary conductor 14 by at least 50 microns, and in another embodiment the insulator portion 40 extends beyond the edge 14*e* of the primary conductor 14 by at least 375 microns. An embodiment may have the insulator portion 40 not extend beyond the edge 14*e* of the primary conductor 14 where the other dimensions provide sufficient electrical isolation for the desired application.

In embodiments, the lead frame 12 can be stamped from a copper sheet and can be relatively thick (e.g., at least 15 mils thick) in order to support high current (e.g., 200 amps) applications. Alternatively, lead frame 12 can include interconnected metal layers as may be part of a so-called molded interconnect substrate (MIS) that includes a pre-molded structure with one or more layers, with each layer configured with plating or interconnects to provide electrical connections in the package.

Each of the input and output portions 14*a*, 14*b* of the primary current conductor 14 can include die attach portions 106, 108, respectively, and a current path portion 107. The primary conductor 14 supports insulator, or insulator portion 40, and semiconductor die 30. Die attach portions 106, 108 can alternatively be referred to as die attach pads or paddles. Die 30 supports at least one magnetic field sensing element, and, in an example embodiment, supports at least two magnetic field sensing elements 32, 34. The die 30 can also support circuitry to amplify and process signals from the magnetic field sensing elements 32, 34 and provide an output of the current sensor integrated circuit 10. As current flows through the primary conductor 14, a magnetic field is generated and may be sensed by magnetic field sensing elements 32, 34. In some embodiments, each element 32, 34 is comprised of a plurality of elements, such as four, as may be coupled in a bridge configuration.

In embodiments, the input portion 14*a* of the primary conductor 14 is exposed from the first side edge 52 of the package body 50 and the output portion 14*b* of the primary conductor 14 is exposed from the second side edge 54 of the package body that is substantially parallel with respect to the first side edge of the package body.

From the bottom views of FIGS. 4 and 5, it can be seen that each of the secondary leads 20*a*, 20*b*, 20*c*, 20*d*, 20*e*, 20*f* has an exposed portion 24*a*, 24*b*, 24*c*, 24*d*, 24*e*, 24*f*, respectively, on the bottom of the package. Further, lower surface 14*c* of the primary conductor 14 including at least a portion of die attach portions 106, 108, current conductor portion 107, and input and output portions 14*a*, 14*b* are also exposed on the bottom of package 10.

In use, exposed surface 14*c* of the primary conductor 14 may be connected to a circuit board or other substrate. For example, portions 106, 108 can be soldered to a PCB so that current can flow from portion 106 through portion 107 and to portion 108 to generate a magnetic field to be detected.

The current path portion 107 of the primary conductor 14 that interconnects die attach pads 106, 108 can be narrowed, as shown. Die attach pads 106, 108 may also act as primary current input and output portions, like a primary current lead. The primary conductor 14 has a partial current path that forms a line across the package body 50 from the first side edge 52 of the package to the second side edge 54 of the package. If die attach pads 106, 108 are used for primary current input and output leads or portions, then the current may not go through, or may be reduced through the input and output portions 14*a*, 14*b* of the primary conductor 14.

According to another aspect of the disclosure, the package body 50 has a first cutout 56 in the first side edge 52 configured to expose the reduced area edge 18*a* of the input portion 14*a* of the primary conductor 14 and a second cutout 58 in the second side edge 54 configured to expose the reduced area edge 18*b* of the output portion 14*b* of the primary conductor 14, wherein the first side edge 52 of the package body is substantially parallel with respect to the second side edge 54 of the package body. Cutouts 56, 58 in the package body 50 are shaped and sized to result in the input and output portions 14*a*, 14*b* of the primary conductor 14 being inside the outline of the substantially rectangular package body. Stated differently, the reduced area edge 18*a* of the input portion 14*a* of the primary conductor 14 does not extend beyond the first side edge 52 of the package body 50 and the reduced area edge 18*b* of the output portion 14*b* of the primary conductor 14 does not extend beyond the second side edge 54 of the package body. This arrangement advantageously prevents the IC packages from jamming in the tube during testing.

The magnetic field sensing elements 32, 34 are positioned off of or to the side of the current conductor portion 107 so that the magnetic field generated by the current flowing in the current conductor portion 107 has a directional component that is perpendicular, or in an embodiment near perpendicular (e.g., in some embodiments within +/−20 degrees of perpendicular and in other embodiments more than +/−20 degrees), to the die 30 such that planar Hall effect elements may be used for magnetic field sensing elements 32, 34. If the magnetic field sensing elements 32, 34 are Hall effect elements, one Hall effect element may be designed to have a positive voltage output when the magnetic field sensed is out of the die 30 (where for clarity "out" is the direction away from the current conductor portion 107), and the second Hall effect element may have a negative voltage when the magnetic field sensed is out of the die 30. Various processing circuitry is responsive to signals from the magnetic field sensing elements for generating an output signal indicative of the current through the current conductor portion 107. Such processing circuitry can include, but is not limited to an amplifier, and in some embodiments a differential amplifier, supported by the integrated circuit die 30 and configured to generate a signal indicative of the difference between the two Hall effect element output voltages. Using the difference between the two magnetic field sensing element output voltages when they are Hall effect elements allows for the integrated circuit to reduce or eliminate the effects of external magnetic fields that are not a result of current through the primary current path, including the current conductor portion 107 (i.e., stray magnetic fields). In other embodiments, the magnetic field sensing elements, or a magnetic field element may be positioned on die 30 over the primary current conductor portion 107 to sense a magnetic field with a component parallel to the surface of die 30. In a case where the magnetic field component to be sensed is parallel to the surface of the die 30, a vertical Hall effect element or a magnetoresistance element such as a GMR, TMR, or AMR element may be used.

Die 30 is supported by one or both of the die attach portions 106, 108 and is positioned over the insulator portion 40. Die 30 may be attached to the insulator portion 40 by a non-conductive coating (not shown), such as a wafer backside coating (WBC) or a non-conductive epoxy and the insulator portion 40 is attached to die attach portions 106, 108. Alternatively, the die 30 can be attached to the insulator portion 40 by a conductive material as may reduce the effects of partial discharge from voids in the die attach material. Die 30 may be attached to die attach portions 106, 108 by insulator portion 40 where the insulator is a dielectric tape, for example a Kapton® or other insulating tape with a layer of adhesive on one side of the tape or on each side of the dielectric tape layer. In another embodiment, an epoxy die attach material, a die-attach film (DAF), or an insulating coating material may be applied as the insulator portion 40 in place of the tape. Aspects of insulator portion 40 can be the same as or similar to insulation structures described in U.S. Pat. No. 10,753,963, issued on Aug. 25, 2020, entitled "Current Sensor Isolation" and hereby incorporated herein by reference in its entirety.

In manufacturing, if two layers of wafer backside coating are used, a first wafer backside coating layer 105 may be fully cured (or partially cured if only one layer of a wafer backside coating is used) before a second layer of wafer backside coating is partially cured (also known as B stage cured) to attach die 30 to insulator portion 40.

In another embodiment, the die 30 may be attached to the insulator portion 40 by other materials, including but not limited to a non-conductive die attach epoxy, or a tape. Multiple layers of wafer backside coating, tape, DAF and non-conductive epoxy may be used for electrical isolation. A combination of wafer backside coating, tape, DAF, or non-conductive epoxy may be used to achieve electrical isolation and attachment to the die attach portion 106, 108.

The insulator portion 40 can provide a second layer of isolation between the primary conductor 14 and wire bonds 26*a*-26*f* and secondary leads 20*a*-20*f*, which allows a thinner package than if a 0.4 mm distance were required. It will be appreciated that the isolation distances can be readily varied by stretching or shortening the length of the enclosed portion of the secondary leads in order to achieve a desired isolation voltage.

As noted above, the insulator portion 40 can extend beyond one or more edges, such as a top edge 14*e* and/or a side edge 14*d* of the primary conductor 14 in the direction of, or from the side of the primary conductor towards, the secondary leads 20*a*-20*f*. For example, in embodiments, the insulator portion 40 may extend beyond the top edge 14*e* of the primary conductor 14 in the direction of the secondary leads 20*a*-20*f* by at least 0.1 mm, 0.2 mm, or 0.4 mm depending on the voltage isolation requirements.

According to an example manufacture process, lead frame 12 is formed with primary current conductor 14 and secondary signal leads 20*a*-20*f*, following which insulation portion 40 is applied to the primary conductor. The insulation 40 may comprise one or more of a dielectric tape, an insulating epoxy material, or a piece of insulating material including but not limited to alumina or glass substrate material. The integrated circuit die 30 is then attached to the subassembly. Attachment of the die 30 can include, but is not limited to, use of a wafer backside coating material, a tape attachment material, and/or an insulating epoxy material, which may also be referred to as a non-conductive epoxy material.

The integrated circuit die 30 is electrically connected to the signal leads 20*a*-20*f*, such as with wire bonds 26*a*-26*f*, respectively. Other electrical connections, including flip-chip assembly methods, may be used provided they meet the isolation requirements of the application. Thereafter, a mold material is applied to the subassembly including the lead frame 12, integrated circuit die 30, and wire bonds 26*a*-26*f* in order to form package body 50.

After the mold process that forms the package body 50, the packages are cut, or singulated, with a process such punching, to form individual integrated circuit packages.

Singulation results in the above-described configuration in which the primary conductor does not extend beyond the molds. As described above, advantageously, the reduced area edges 18*a*, 18*b* reduce the force required for punch singulation and thereby reduce the stress on the resulting IC packages and wear on the punch tool.

Other steps may follow manufacturing which include, but are not limited to a final test procedure, or programming the integrated circuit package. In the case of a current sensor integrated circuit package, there may be a test step and maybe programming of the integrated circuit die at the integrated circuit package level, and then a second test and programming may be performed, for example, when the current sensor integrated circuit package is applied to a printed circuit board or other assembly where the current sensor integrated circuit package is used. This second programming after assembly of the current sensor integrated circuit package onto a PC board or other assembly, allows a more accurate measurement of the current to be made as other influences such as PC board currents can be accounted for in the current sensor integrated circuit. As noted above, provision of cutouts 56, 58 in the side edges 52, 54 of package body 50 such that the reduced area edges 18*a*, 18*b* of the primary conductor 14 do not extend beyond the package body edges 52, 54 facilitates testing by reducing jamming of the package in the tube used for testing.

Figure 7:
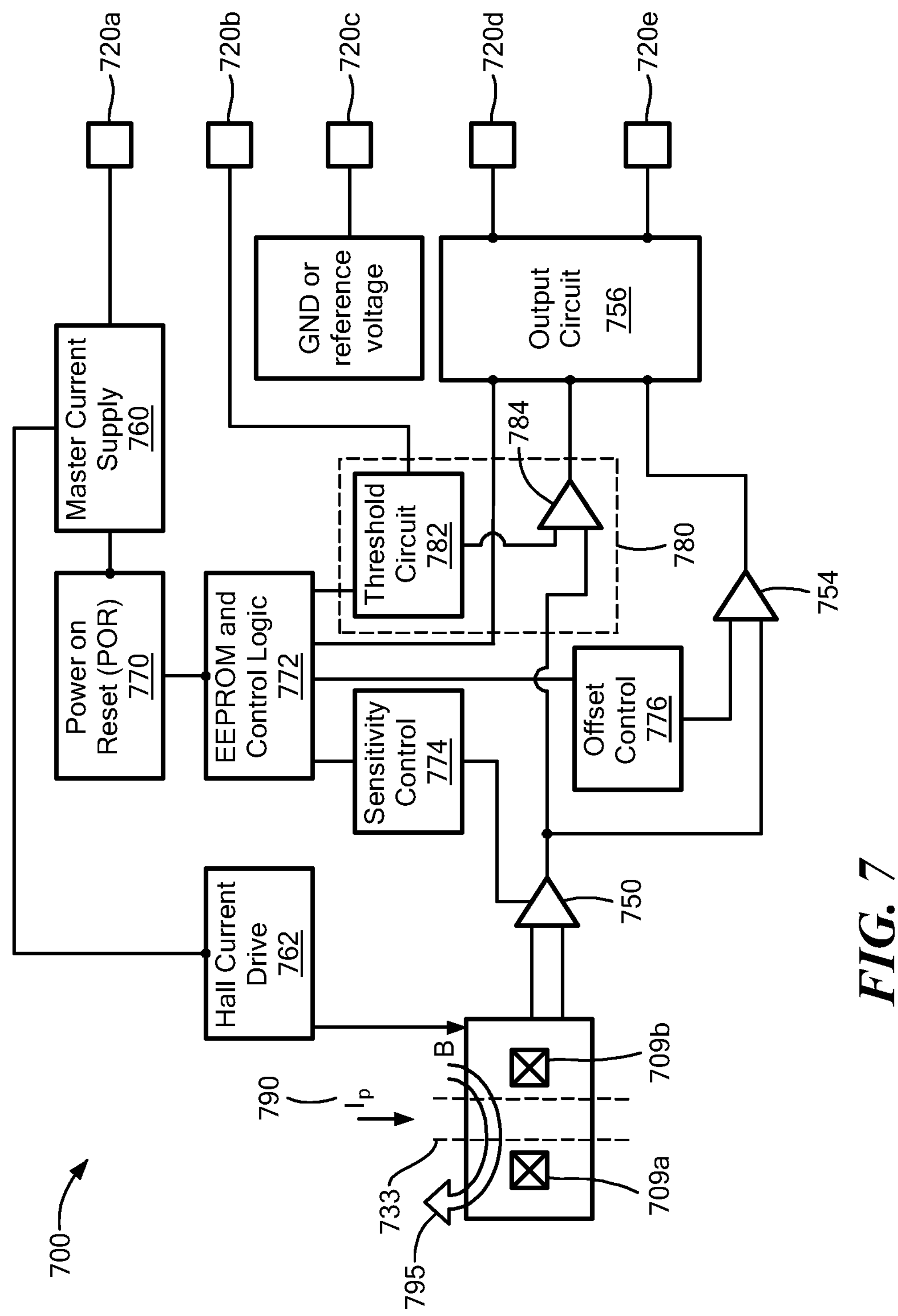
FIG. 7 is a schematic of an example current sensor.
Figure 8:
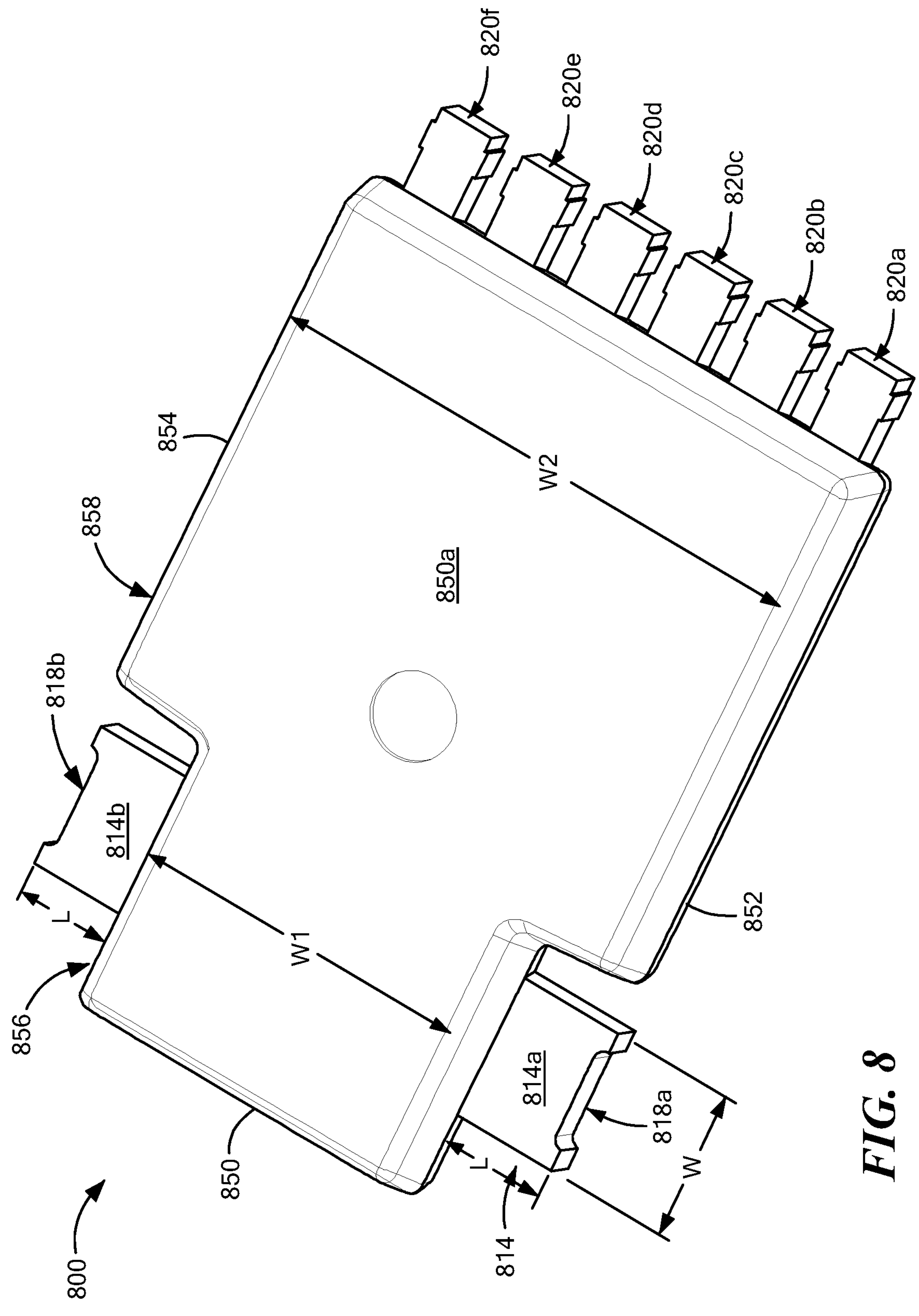
FIG. 8 is a perspective top view of a packaged current sensor integrated circuit according to the disclosure.

Referring to FIG. 7, a schematic of an example circuit block diagram for an integrated circuit 700 which may be on the die 30 (or die 830) is shown. The primary current $I_p$ 790 flows through a current conductor portion 733 (that may be the same as or similar to primary conductor 14) and generates a magnetic field B 795. The magnetic field B 795 can contain a component which comes up into the die at magnetic field sensing element 709*b* and down into the magnetic field sensing element 709*a*. The magnetic field sensing elements 709*a*, 709*b* may be planar Hall effect plates for example. The magnetic field 795 results in Hall effect plates 709*a*, 709*b* providing a signal to a front-end amplifier 750. A chopping or mixing circuit can be coupled between the Hall effect plates 709*a*, 709*b* and the amplifier 750. The front-end amplifier 750 provides an output to amplifier 754, which may be a linear amplifier, which feeds into an output circuit 756. Output circuit 756 may be a digital or analog circuit that provides an output to at least one bond pad 720*d*, 720*e*. Output bond pad 720*e* may be a linear output that represents the magnetic field 795 measured and amplified through the amplifier 754. Other numbers of output bond pads more than two may also be provided. In an alternate embodiment, the amplifier 754 may provide an output directly to bond pad 720*e*. Output bond pad 720*d* may be a fault output representative of a fault condition in the current sensor integrated circuit package.

Bond pad 720*a* provides a voltage and current input, typically Vcc, to provide power to the integrated circuit 700. A ground bond pad 720*c* may be provided to integrated circuit 700. In another embodiment, the voltage level provided at bond pad 720*c* may be other than ground, or a voltage above or below ground as a reference voltage to integrated circuit 700. Input bond pad 720*a* is coupled to a master current supply circuit 760 that provides power to the circuitry within integrated circuit 700. Although master current supply 760 is provided as a current supply, it would be apparent that voltages may also be provided to the circuits on integrated circuit 700. A Hall effect current drive circuit 762 takes current (or voltage) from the master current supply 760 and provides a regulated current to the Hall Effect sensing elements 709*a*, 709*b*. The master current supply 760 also provides power to a power on reset circuit 770. The power on reset circuit monitors the power coming into the circuit 700 and provides a signal to EEPROM and control logic circuit 772. The power on reset circuit 770 and EEPROM and control logic circuit 772 are used to configure and enable the integrated circuit, including the output circuit 756.

The EEPROM and control circuit 772 provides a signal to a sensitivity control circuit 774 which provides a signal to the front end amplifier 750 to adjust the sensitivity of the front end amplifier. The adjustment may be the result of a change in the power level in the circuit 700, or as a result of a temperature change of the circuit 700. An example of a temperature sensor circuit may include but is not limited to a diode temperature sensor, or the use of known temperature compensation resistors.

The EEPROM and control circuit 772 provides a signal to an offset control circuit 776. The offset control circuit 776 provides a signal to the amplifier 754. The offset control circuit 776 allows the circuit 700 to adjust the offset of the amplifier 754 for changes in power or temperature (the temperature compensation circuit is not shown) or a combination of temperature and power changes. The offset control circuit 776 may also provide adjustment for other offset sources, such as a stress in the integrated circuit die.

In another embodiment the EEPROM in the EEPROM and control circuit 772 may be replaced by another type of memory or used in combination with another type of non-volatile memory, including but not limited to a metal or polysilicon fuse, flash memory, or MRAM.

An input lead 720*b* may be provided to set a threshold for a fault indication circuit 780 (i.e., provide a fault trip level). In an embodiment, the input lead 720*b* provides a fault voltage level. The fault indication circuit 780 can include a threshold circuit 782 and a fault comparator 784. The EEPROM and control circuit 772 provides an input to the threshold circuit 782. The threshold circuit 782 provides a signal to the fault comparator 784, which compares the output of threshold circuit 782 with the output of the front end amplifier 750 to indicate when a fault exists to the output circuit block 756. The output circuit generates a fault output at output bond pad 720*d*. The fault output may indicate an overcurrent condition in which the current sensed in the current conductor path 733 exceeds a fault trip level, which trip level may be provided in the form of a fault voltage level on bond pad 720*b*. The fault allows, in one example, the user of the current sensor package 10 to turn off the current in the primary current path in order to prevent a high current condition in an electrical circuit connected to the primary conductor 14.

In an embodiment, functionality of the fault indication circuit 780 may be performed in a digital circuit or digital processor. The comparison to the fault trip level may include an analog to digital converter (ADC) prior to a digital logic circuit, which may include a processor or microprocessor circuit, which compares the fault trip level voltage to a voltage provided by the front end amplifier and an ADC circuit to convert the analog voltage of the front end amplifier 750 to a digital voltage. In an embodiment, the amplifier 750 may be a buffer amplifier with a gain near or equal to unity (or one). In another embodiment, the amplifier 754 may be introduce a non-unity gain.

In an embodiment, a multiplexer circuit may be used to allow for the output of front end amplifier circuit 750 and the fault trip level voltage to use the same ADC. It will be apparent to those of ordinary skill in the art that other circuits, such as timing circuits and sample and hold circuits, may be used to implement a multiplexed digital circuit.

Figure 9:
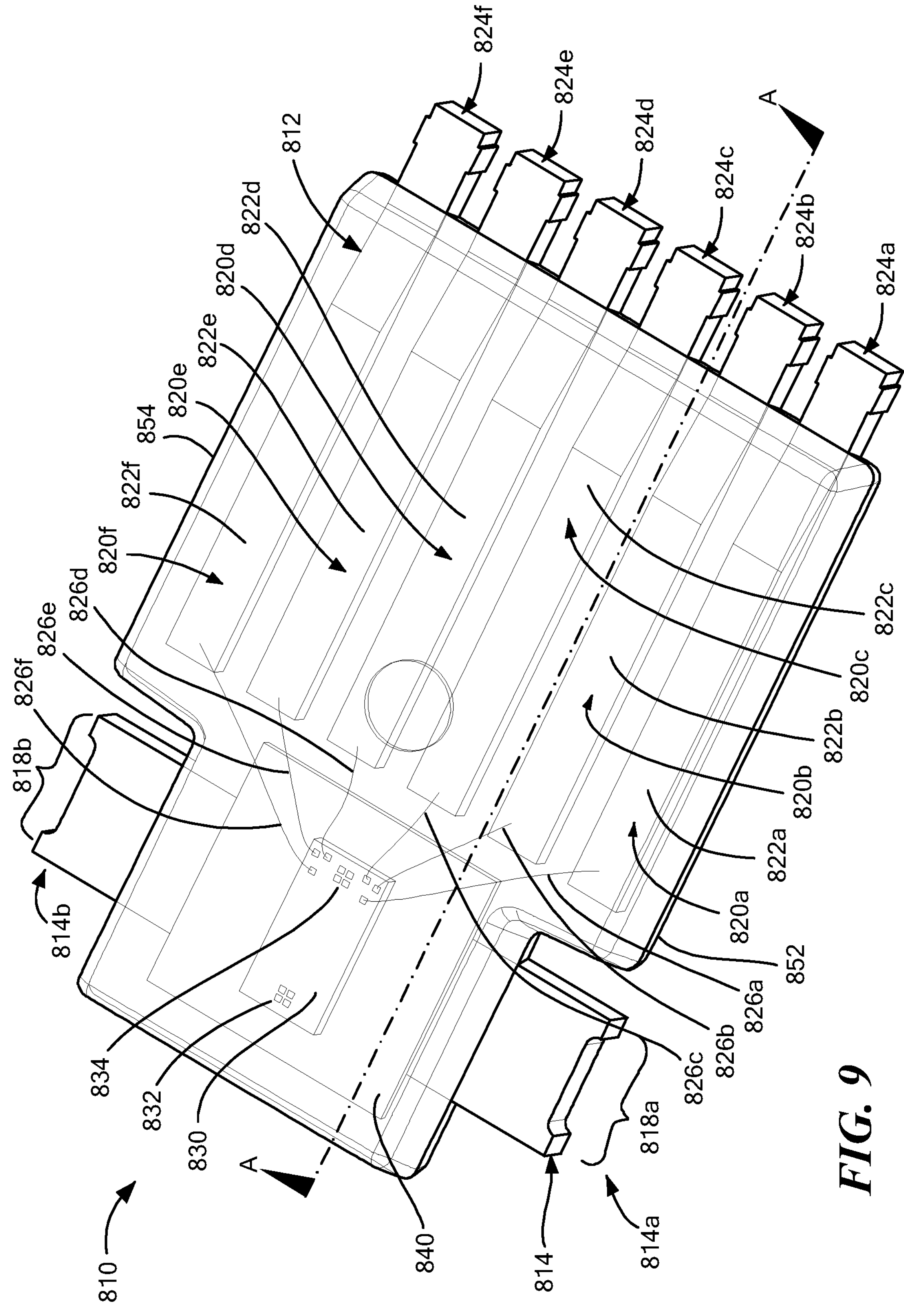
FIG. 9 shows the packaged current sensor integrated circuit of FIG. 8 with the package body in phantom.
Figure 10:
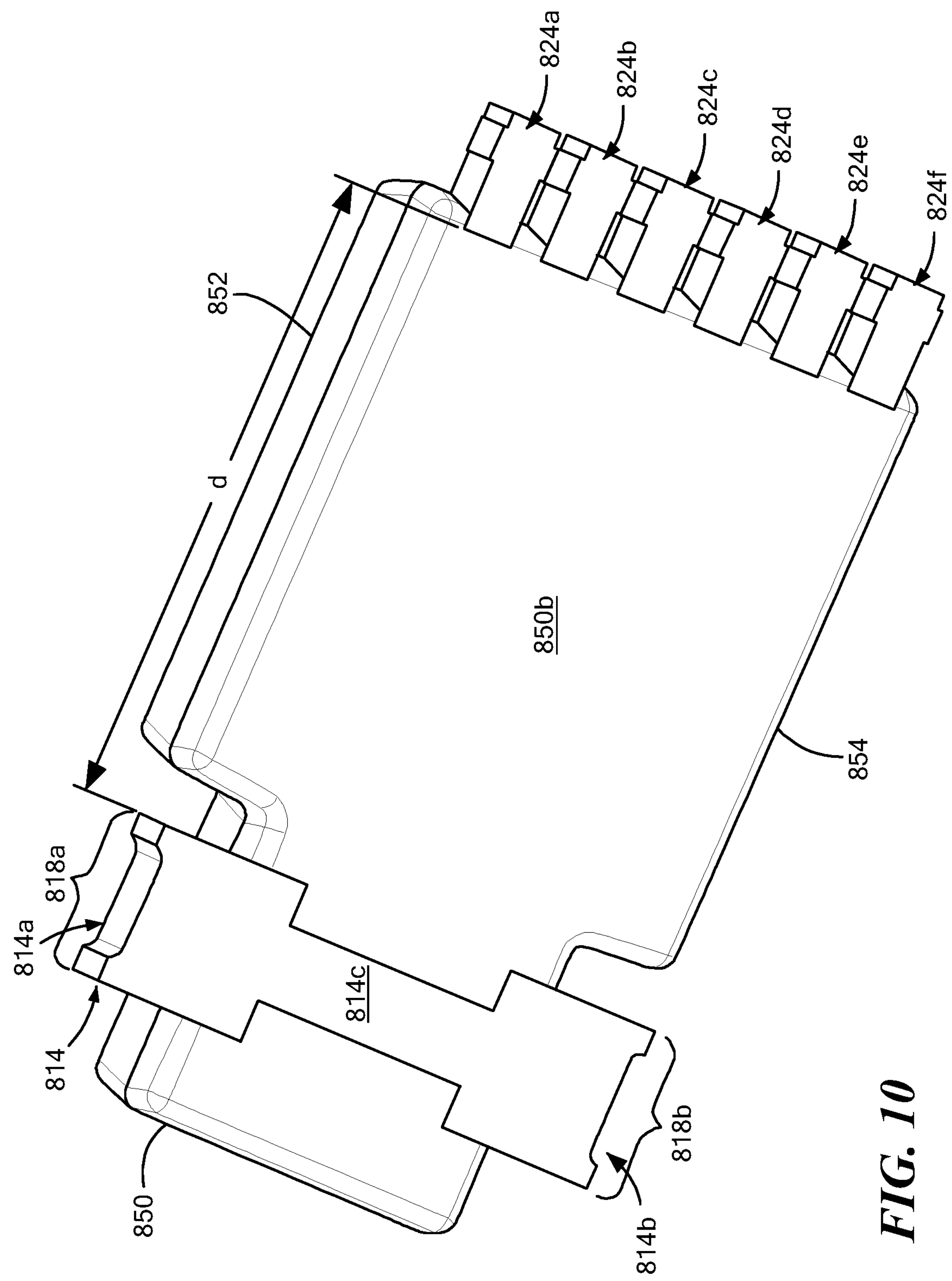
FIG. 10 is a bottom view of the packaged current sensor integrated circuit of FIG. 8.
Figure 11:
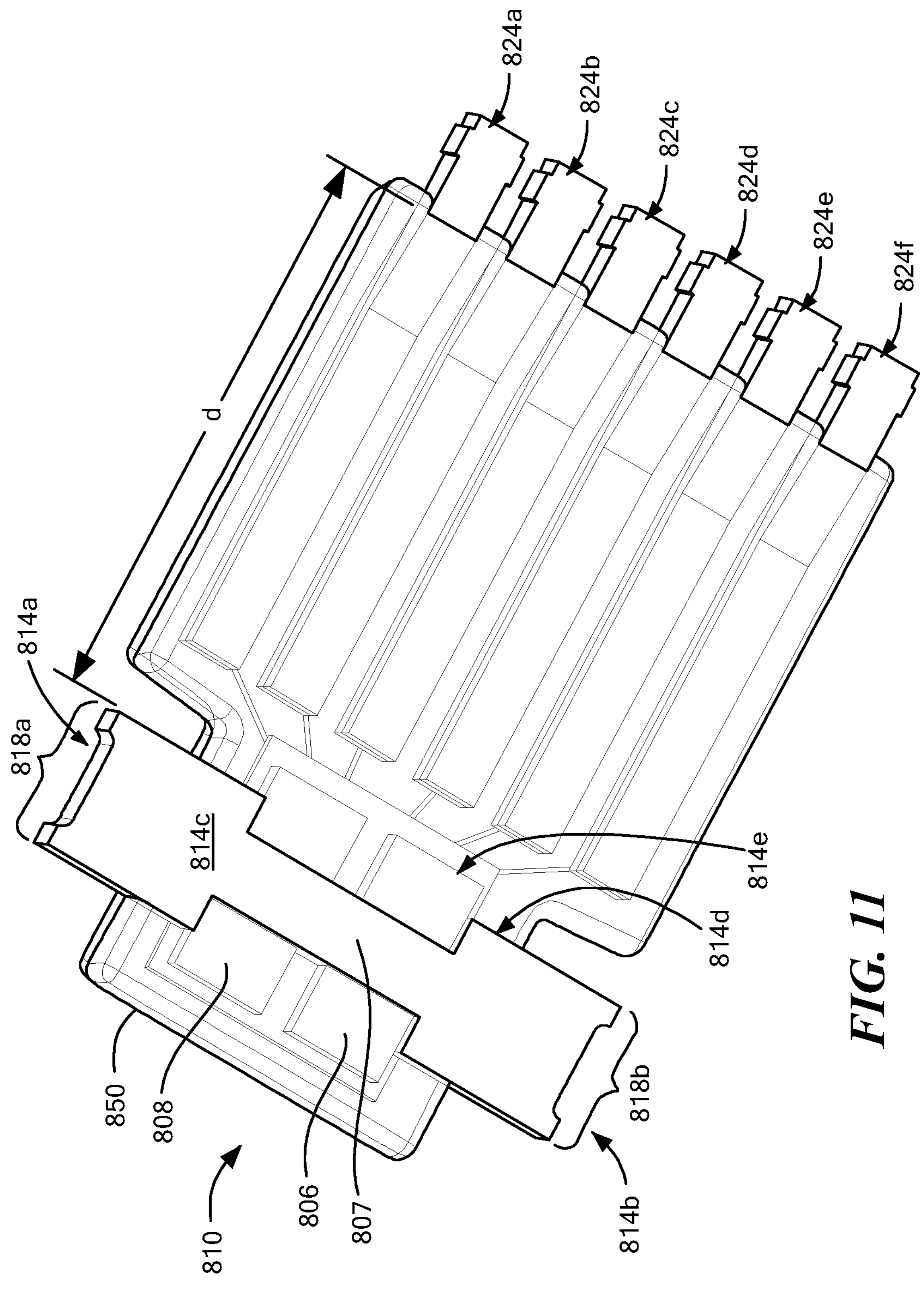
FIG. 11 is a bottom view of the packaged current sensor integrated circuit of FIG. 8 with the package body in phantom.

Referring to the various views of FIGS. 8-12, another packaged current sensor integrated circuit (IC) 800 includes a primary conductor 814 having an input portion 814*a* into which a current flows, an output portion 814*b* from which the current flows, and an exposed portion 814*c* (shown in the bottom views of FIGS. 10 and 11). A secondary lead, such as lead 820*a*, has an exposed portion 824*a* that is spaced from the exposed portion 814*c* of the primary conductor 814 by an isolation distance "d" (shown in the views of FIGS. 10, 11, and 12). A semiconductor die 830 is disposed adjacent to the primary conductor 814 and is positioned on an insulator portion 840. At least one magnetic field sensing element 832, 834 is supported by the semiconductor die 830. A package body 850 encloses the semiconductor die 830 and a portion of the primary conductor 814 and has an upper package body surface 850*a*, a lower package body surface 850*b*, and side package edges 852, 854. A lead frame 812 (labeled in FIG. 9) includes the primary conductor 814 and one or more secondary leads (here a plurality of secondary leads 820*a*-820*f*).

The example current sensor IC 800 has secondary leads 820*a*, 820*b*, 820*c*, 820*d*, 820*e*, 820*f*. In other embodiments, in which fewer than the illustrated six leads are required or more than the illustrated six leads are required for providing more power, ground, output signals, a fault signal, or other input and output pins, there may be fewer or more than six secondary leads. Wire bonds 826*a*, 826*b*, 826*c*, 826*d*, 826*e*, 826*f* connect the die 830 to the secondary, or signal leads, 820*a*, 820*b*, 820*c*, 820*d*, 820*e*, 820*f*, respectively, as shown in the view of FIG. 9. In an embodiment, one or more secondary leads 820*a*, 820*b*, 820*c*, 820*d*, 820*e*, 820*f* can be connected to die 830 using two or more wire bonds. This may be advantageous when a potential for higher current exists in the operation of the integrated circuit, such as for a power or ground connection to die 830.

Secondary leads 820*a*-820*f* can be elongated from a first end adjacent to the primary conductor 814 to the exposed portion 824*a*-824*f*, respectively, and thus, can be described as having an elongated portion 822*a*, 822*b*, 822*c*, 822*d*, 822*e*, 822*f*.

According to an aspect of the disclosure, the package body 850 has a first portion 856 enclosing the semiconductor die 830 and a portion of the primary conductor 814 and a second portion 858 enclosing elongated portion 822*a*-822*f* of the plurality of secondary leads 820*a*-820*f*. The first portion 856 of the package body 850 has a first width "W1" configured to expose the input portion 814*a* of the primary conductor and the output portion 814*b* of the primary conductor and the second portion 858 of the package body 850 has a second width "W2" between the first side edge 852 of the package body and a second side edge 854 of the package body that is larger than the first width.

The exposed input portion 814*a* of the primary conductor 814 and the exposed output portion 814*b* of the primary conductor 814 each can have a length "L" of at least 0.5 mm. In some embodiments, the exposed length can be between 0.5 mm-1.5 mm. The exposed input portion 814*a* of the primary conductor and the exposed output portion 814*b* of the primary conductor are configured to accept one or both of a clamp or a test probe.

Lead frame 812 can be stamped from a copper sheet and can be relatively thick (e.g., at least 15 mils thick) in order to support high current (e.g., 200 amps) applications. In lower current applications, more standard lead frame thicknesses, such as on the order of 8 or 10 mils can be used. Alternatively, lead frame 812 can include interconnected metal layers as may be part of a so-called molded interconnect substrate (MIS) that includes a pre-molded structure with one or more layers, with each layer configured with plating or interconnects to provide electrical connections in the package.

The primary current conductor 814 can include die attach portions 806, 808 and a current path portion 807 between the die attach portions. The primary conductor 814 supports insulator, or insulator portion 840, and semiconductor die 830. Die attach portions 806, 808 can alternatively be referred to as die attach pads or paddles. Die 830 supports at least one magnetic field sensing element, and, in an example embodiment, supports at least two magnetic field sensing elements 832, 834. The die 830 can also support circuitry to amplify and otherwise process signals from the magnetic field sensing elements 832, 834 and provide an output of the current sensor integrated circuit 800. As current flows through the primary conductor 814, a magnetic field is generated and sensed by magnetic field sensing elements 832, 834. In some embodiments, each element 832, 834 is comprised of a plurality of elements, such as four, as may be coupled in a bridge configuration.

In embodiments, the input portion 814*a* of the primary conductor 814 is exposed from the first side edge 852 of the package body 850 and the output portion 814*b* of the primary conductor 814 is exposed from the second side edge 854 of the package body that is substantially parallel with respect to the first side edge of the package body.

The input portion 814*a* of the primary conductor 814 has a reduced area edge 818*a* and the output portion 814*b* has a reduced area edge 818*b*. By reduced area edge it is meant that the edge surface has a reduced surface area as compared to a flat edge. Each example reduced area edge 818*a*, 818*b* has a notch between edge ends, as shown. The reduced area edges 818*a*, 818*b* provide tie bars which, during fabrication, are connected to like edges of primary conductors of adjacently fabricated packages. In other words, multiple current sensor integrated circuits are fabricated from a single lead frame (coupled together by tie bars in the form of the reduced area edges 818*a*, 818*b*) and are singulated along the side edges 852, 854 of the package body 850 through the reduced area edges 818*a*, 818*b*.

Providing primary conductor edges 818*a*, 818*b* along which the package is singulated (i.e., the connecting tie bar area) with a reduced area (i.e., as opposed a solid edge of a width "w" that needs to be cut) reduces the force required by the singulation process. For example, in the case of punching to singulate, the force required to punch through the reduced edge area is less and therefore, the IC package experiences lower stress and wear on the punch tool is reduced.

Reduced edge areas 818*a*, 818*b* are spaced by less than or equal to the width W2 between the first side edge 852 of the package body and a second side edge 854 of the package body so that edge area 818*a* does not extend beyond side edge 852 and edge area 818*b* does not extend beyond side edge 854. This arrangement advantageously prevents the IC packages from jamming in the tube during testing.

Figure 12:
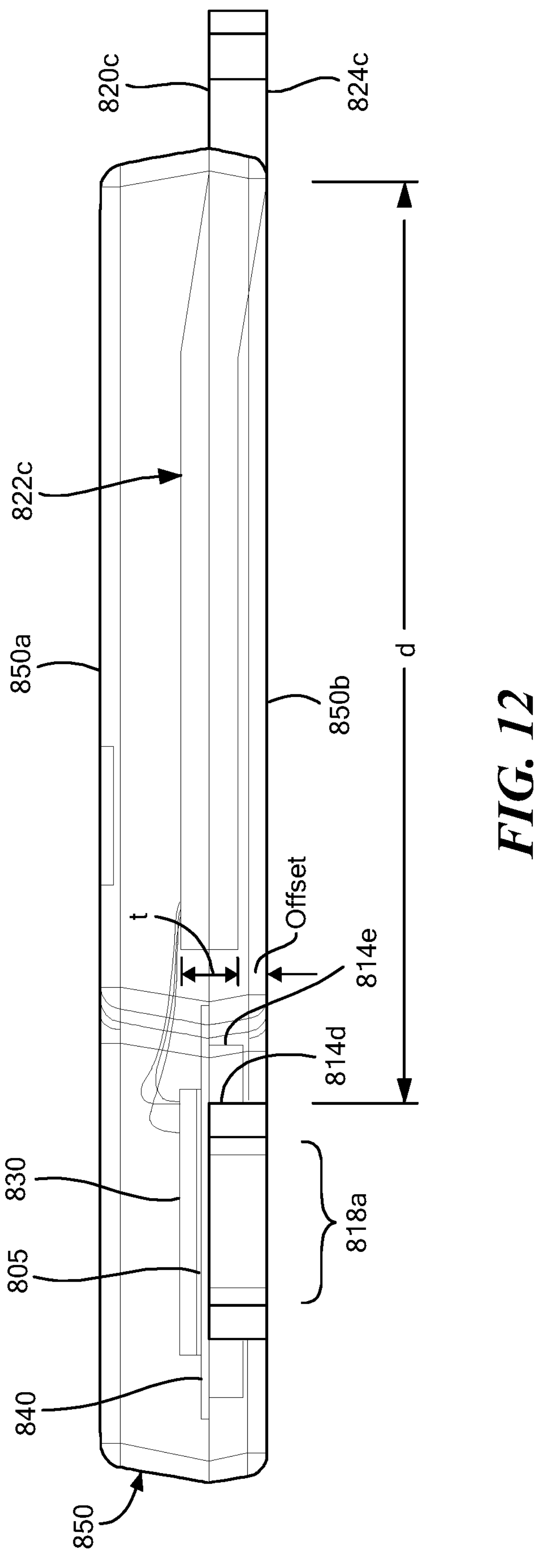
FIG. 12 is a cross-sectional side view of the packaged current sensor integrated circuit of FIG. 1 taken along the line A-A of FIG. 9.

The elongated portion 822*a*, 822*b*, 822*c*, 822*d*, 822*e*, 822*f* of the secondary leads 820*a*, 820*b*, 820*c*, 820*d*, 820*e*, 820*f*, and 820*g*, respectively, is offset with respect to the exposed portion 824*a*, 824*b*, 824*c*, 824*d*, 824*e*, 824*f* of the respective secondary lead in a direction of the package height or, in other words, the secondary leads 820*a*-820*f* are offset with respect to the exposed portions 824*a*-824*f* in the direction of a thickness "t" as shown (see FIG. 12). A typical lead thickness "t" can be on the order of 0.5 mm. In embodiments, the dimension of the offset of the secondary leads 820*a*-820*f* can be on the order of 0.25 mm. However, it will be appreciated by those of ordinary skill in the art that a smaller offset dimension, such as on the order of 0.1 mm, or a larger offset dimension are possible. With this arrangement, achieving a desired creepage distance can be facilitated by providing the secondary leads 820*a*-820*f* with an offset elongated portion 822*a*-822*f* that is thereby encapsulated by the package body 850.

The illustrated secondary leads 820*a*-820*f* can have a substantially constant thickness "t" (labeled in FIG. 12) or can have a thinned elongated portion formed by of a half etch process. In embodiments, the isolation, or creepage distance "d" is at least 7.2 mm and can be at least 8.0 mm. With a creepage distance of at least 7.2 mm, reinforced isolation according to a standard, such as IEC60664, is achieved for basic working voltages >1000 VRMS. In some embodiments, lower voltage isolation requirements may exist and the isolation distance "d" may be at least 1.0 mm, 2.0 mm, or 4.0 mm to meet certain isolation requirements in different applications.

Clearance refers to the shortest distance between conductors of differing voltage levels, such as between primary and secondary conductors, through an insulating material, such as air outside of the package or through an insulating material inside or outside the package.

Increased clearance distance can be facilitated by the insulator portion 840 extending beyond an edge, such as a top edge 814*e* of the primary conductor 814 as shown in FIG. 12, since such extended insulator portion increases the clearance distance between the lower voltage level semiconductor die 830 and the higher voltage primary conductor 814. The insulator portion 840 extends beyond edge 814*e* of the primary conductor 814 in order to provide voltage isolation. In general (although the illustrated insulator portion 840 extends beyond the primary conductor edge 814*e* in an example embodiment), the insulator portion 840 need only extend beyond the die 830 by at least 200 microns and preferably by 400 microns. In an embodiment, the insulator portion 840 may extend beyond the edge 814*e* of the primary conductor 814 by at least 50 microns, and in another embodiment the insulator portion 840 extends beyond the edge 814*e* of the primary conductor 814 by at least 375 microns. An embodiment may have the insulator portion 840 not extend beyond the edge 814*e* of the primary conductor 814 where the other dimensions provide sufficient electrical isolation for the desired application.

From the bottom views of FIGS. 10 and 11, it can be seen that each of the secondary leads 820*a*, 820*b*, 820*c*, 820*d*, 820*e*, 820*f* has an exposed portion 824*a*, 824*b*, 824*c*, 824*d*, 824*e*, 824*f*, respectively, on the bottom of the package. Further, lower surface 814*c* of the primary conductor 814 is also exposed on the bottom of package 800. In use, exposed surface 814*c* of the primary conductor 814 may be connected to a circuit board or other substrate.

Current path portion 807 of the primary conductor 814 between the input and output portions 814*a*, 814*b* can be narrowed, as shown, to concentrate the magnetic field in the vicinity of the sensing elements 832, 834. Die attach portions 806, 808 are configured to enhance mechanical securing of the mold material 850 to the lead frame.

As discussed above in connection with the embodiment of FIGS. 1-6, magnetic field sensing elements 832, 834 are positioned off of or to the side of the current conductor portion 807 so that the magnetic field generated by the current flowing in the current conductor portion 807 has a directional component that is perpendicular, or near perpendicular, to the die 830 such that planar Hall effect elements may be used. Various processing circuitry is responsive to signals from the magnetic field sensing elements for generating an output signal indicative of the current through the current conductor portion 807. In other embodiments, the magnetic field sensing elements may be positioned over the primary current conductor portion 807 to sense a magnetic field with a component parallel to the surface of die 830, in which case a vertical Hall effect element or a magnetoresistance element such as a GMR, TMR, or AMR element may be used.

Die 830 may be attached to the insulator portion 40 by a non-conductive coating (not shown), such as a wafer backside coating (WBC) or a non-conductive epoxy or a dispensed die attach material, die attach film, or other material. The insulator portion 840 is attached to die attach portions 806, 808. Alternatively, die 830 can be attached to the insulator portion 840 by a conductive material as may reduce the effects of partial discharge from voids in the die attach material. Die 830 may be attached to die attach portions 806, 808 by insulator portion 840 where the insulator is a dielectric tape, for example a Kapton® or other insulating tape with a layer of adhesive on one side of the tape or on each side of the dielectric tape layer. In another embodiment, an epoxy die attach material, a die-attach film (DAF), or an insulating coating material may be applied as the insulator portion 840 in place of the tape. Further, thin fiberglass, glass, ceramic or other thin insulating layers can be used instead of tape. Aspects of insulator portion 840 can be the same as or similar to insulation structures described in U.S. Pat. No. 10,753,963, issued on Aug. 25, 2020, entitled "Current Sensor Isolation" and hereby incorporated herein by reference in its entirety. If two layers of wafer backside coating are used, a first wafer backside coating layer 805 may be fully cured (or partially cured if only one layer of a wafer backside coating is used) before a second layer of wafer backside coating is partially cured (also known as B stage cured) to attach die 830 to insulator portion 840.

In another embodiment, die 830 may be attached to the insulator portion 840 by other materials, including but not limited to a non-conductive die attach epoxy, or a tape. Multiple layers of wafer backside coating, tape, DAF and non-conductive epoxy may be used for electrical isolation. A combination of wafer backside coating, tape, DAF, or non-conductive epoxy may be used to achieve electrical isolation and attachment to the die attach portion 806, 808.

The insulator portion 840 can provide a second layer of isolation between the primary conductor 814 and wire bonds 826*a*-826*f* and secondary leads 820*a*-820*f*, which allows a thinner package than if a 0.4 mm distance were required. It will be appreciated that the isolation distances can be readily varied by stretching or shortening the length of the enclosed portion of the secondary leads in order to achieve a desired isolation voltage.

As noted above, the insulator portion 840 can extend beyond one or more edges, such as a top edge 814*e* and/or a side edge 814*d* of the primary conductor 814 in the direction of, or from the side of the primary conductor towards, the secondary leads 820*a*-820*f*. For example, in embodiments, the insulator portion 840 may extend beyond the top edge 814*e* of the primary conductor 814 in the direction of the secondary leads 820*a*-820*f* by at least 0.1 mm, 0.2 mm, or 0.4 mm depending on the voltage isolation requirements.

Current sensor IC 800 can be manufactured in a manner that is the same as or similar to the process explained above in connection with the embodiment of FIGS. 1-6. Manufacturing steps, including test steps, can be facilitated by the package body design with the first portion 856 having a width W1 configured to expose the input portion 814*a* of the primary conductor and the output portion 814*b* of the primary conductor. As noted above, the exposed input portion 814*a* of the primary conductor 814 and the exposed output portion 814*b* of the primary conductor 814 each can have a length of at least 0.5 mm. In some embodiments, the exposed length can be between 0.5 mm-1.5 mm. The exposed input portion 814*a* of the primary conductor and the exposed output portion 814*b* of the primary conductor are configured to accept one or both of a clamp or a test probe.

It is understood that any of the above-described processing may be implemented in hardware, firmware, software, or a combination thereof. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of elements can refer to either a direct or an indirect coupling, and a positional relationship between entities can be a direct or indirect positional relationship. As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s). Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Also, the following definitions and abbreviations are to be used for the interpretation of the claims and the specification. The terms "comprise," "comprises," "comprising, "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A current sensor integrated circuit package comprising:

a primary conductor having an input portion into which a current flows, an output portion from which the current flows, and an exposed portion, wherein the input portion has a reduced area edge and the output portion has a reduced area edge;

a plurality of secondary leads, each having an exposed portion spaced from the exposed portion of the primary conductor by an isolation distance of at least 2.0 mm, wherein an elongated portion of each of the plurality of secondary leads is offset with respect to the exposed portion of the respective secondary lead;

a semiconductor die disposed adjacent to the primary conductor and positioned on an insulator portion;

at least one magnetic field sensing element supported by the semiconductor die; and a package body comprising a first portion enclosing the semiconductor die and a portion of the primary conductor and a second portion enclosing the elongated portion of the plurality of secondary leads, wherein the first portion of the package body has a first width configured to expose the input portion of the primary conductor and the output portion of the primary conductor and wherein the second portion of the package body has a second width between a first side edge of the package body and a second side edge of the package body that is larger than the first width, wherein the package body is singulated along the reduced area edge of the input portion of the primary conductor and along the reduced area edge of the output portion of the primary conductor.

2. The current sensor integrated circuit package of claim 1, wherein the exposed input portion of the primary conductor and the exposed output portion of the primary conductor have a length of at least 0.5 mm.

3. The current sensor integrated circuit package of claim 2, wherein the exposed input portion of the primary conductor and the exposed output portion of the primary conductor are configured to accept one or both of a clamp or a test probe.

4. The current sensor integrated circuit package of claim 1, wherein the elongated portion of each of the plurality of secondary leads extends in a direction parallel to the first and second side edges of the package body.

5. The current sensor integrated circuit package of claim 4, wherein the reduced area edge of the input portion of the primary conductor does not extend beyond the first side edge of the package body and wherein the reduced area edge of the output portion of the primary conductor does not extend beyond the second side edge of the package body.

6. The current sensor integrated circuit package of claim 1, wherein each of the plurality of secondary leads has a substantially constant thickness and wherein the elongated portion of each of the plurality of secondary leads is offset with respect to the exposed portion in a direction of a thickness of the respective secondary lead.

7. The current sensor integrated circuit package of claim 1, wherein the elongated portion of each of the plurality of secondary leads has a thickness smaller than a thickness of the exposed portion of the respective secondary lead.

8. The current sensor integrated circuit package of claim 1, wherein the isolation distance is at least 4.0 mm.

9. The current sensor integrated circuit package of claim 1, wherein the isolation distance is at least 7.2 mm.

10. The current sensor integrated circuit package of claim 1, wherein each of the plurality of secondary leads comprises a first secondary lead providing an output connection of the current sensor integrated circuit package, a second secondary lead providing a voltage input connection of the current sensor integrated circuit package, and a third secondary lead providing a ground connection of the current sensor integrated circuit package.

11. The current sensor integrated circuit package of claim 1, further comprising a front-end amplifier supported by the semiconductor die, wherein the at least one magnetic field sensing element is coupled to the front-end amplifier.

12. The current sensor integrated circuit package of claim 1, comprising at least two magnetic field sensing elements.

13. The current sensor integrated circuit package of claim 11, wherein the at least two magnetic field sensing elements are Hall effect elements.

14. The current sensor integrated circuit package of claim 12, wherein the at least two magnetic field sensing elements are coupled to provide a differential output.

15. The current sensor integrated circuit package of claim 1, wherein one or more of the plurality of secondary leads provides a fault signal connection of the current sensor integrated circuit package.

16. The current sensor integrated circuit package of claim 1, further comprising a wafer backside coating material on a back of the semiconductor die.

17. The current sensor integrated circuit package of claim 15, further comprising a second wafer backside coating material on the back of the semiconductor die.

18. The current sensor integrated circuit package of claim 1, wherein the exposed portion of the primary conductor is substantially orthogonal to the first side edge of the package body and the second side edge of the package body.

19. The current sensor integrated circuit of claim 1, wherein the insulator portion extends beyond an edge of the primary conductor in a direction towards the plurality of secondary leads.

20. The current sensor integrated circuit of claim 19, wherein the insulator portion extends beyond the edge of the primary conductor in the direction towards the plurality of secondary leads by at least 0.1 mm.

21. The current sensor integrated circuit of claim 19, wherein the insulator portion extends beyond the edge of the primary conductor in the direction towards the plurality of secondary leads by at least 0.4 mm.

* * * * *